(12) United States Patent
Kasten et al.

(10) Patent No.: US 7,183,769 B2
(45) Date of Patent: Feb. 27, 2007

(54) SUPERCONDUCTING MAGNET SYSTEM WITH DRIFT COMPENSATION

(75) Inventors: Arne Kasten, Karlsruhe (DE); Michael Westphal, Offenbach (DE)

(73) Assignee: Bruker Biospin GmbH, Rheinstetten (DE)

( * ) Notice: Subject to any disclaimer, the term of this patent is extended or adjusted under 35 U.S.C. 154(b) by 94 days.

(21) Appl. No.: 11/047,637

(22) Filed: Feb. 2, 2005

(65) Prior Publication Data
US 2005/0174118 A1 Aug. 11, 2005

(30) Foreign Application Priority Data
Feb. 5, 2004 (DE) .................... 10 2004 005 744

(51) Int. Cl.
*G01V 3/00* (2006.01)
(52) U.S. Cl. ...................................... 324/318; 324/320
(58) Field of Classification Search ................ 324/318, 324/319, 310
See application file for complete search history.

(56) References Cited

U.S. PATENT DOCUMENTS

| 4,788,502 | A |  | 11/1988 | Keller |
|---|---|---|---|---|
| 4,974,113 | A |  | 11/1990 | Gabrielse |
| 5,278,503 | A | * | 1/1994 | Keller et al. ................ 324/318 |
| 6,215,384 | B1 |  | 4/2001 | Laskaris |
| 6,307,370 | B1 | * | 10/2001 | Schauwecker et al. ...... 324/318 |
| 6,563,316 | B2 | * | 5/2003 | Schauwecker et al. ...... 324/318 |
| 6,624,732 | B2 |  | 9/2003 | Biltcliffe |
| 6,727,699 | B2 |  | 4/2004 | Kasten |
| 2002/0101240 | A1 |  | 8/2002 | Kasten |

* cited by examiner

*Primary Examiner*—Louis M. Arana
(74) *Attorney, Agent, or Firm*—Paul Vincent

(57) ABSTRACT

The system describes a means and a method for stabilizing the magnetic field generated in the measuring volume of a high-resolution magnetic resonance spectrometer having an actively shielded magnet coil (4) which is located in a cryostat (2) and which is superconductingly short-circuited. The system comprises a compensation coil (12) which is decoupled from the magnet coil (4), and is disposed on the shielding coil (4b) of the magnet coil (4).

19 Claims, 3 Drawing Sheets

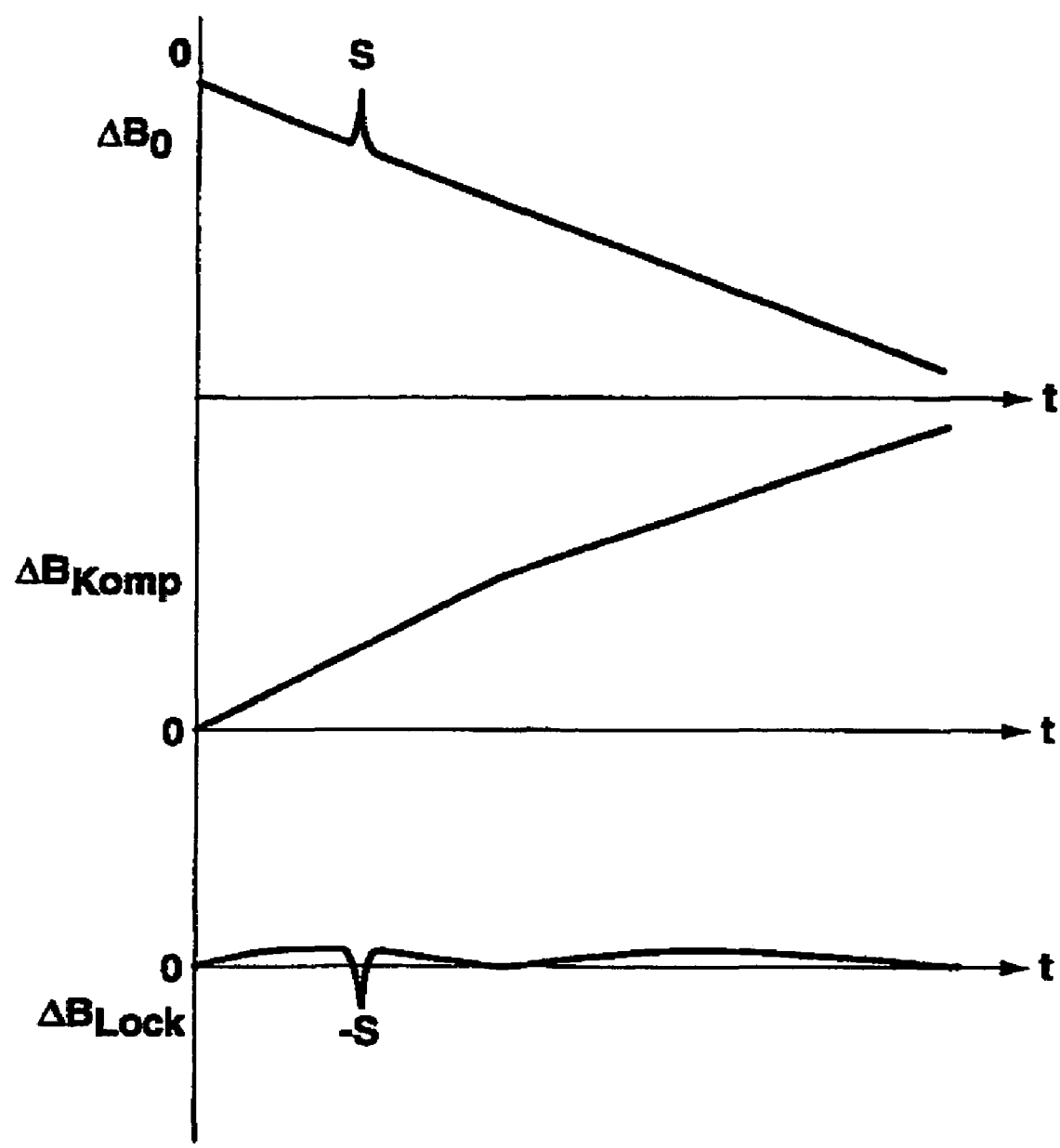

SUPERCONDUCTING MAGNET SYSTEM WITH DRIFT COMPENSATION

This application claims Paris Convention priority of DE 10 2004 005 744.3 filed Feb. 5, 2004 the complete disclosure of which is hereby incorporated by reference.

BACKGROUND OF THE INVENTION

The invention concerns an actively shielded, superconducting magnet system, in particular, for a high-resolution magnetic resonance spectrometer, comprising a substantially cylindrical cryostat with an axial room temperature bore for receiving a sample, a radio-frequency transmitting and detecting system, and a magnet coil which is superconductingly short-circuited during operation and comprises a main coil and a shielding coil which radially surrounds the main coil, wherein the magnet coil is disposed at a low temperature in a region within the cryostat to surround the sample in the room temperature bore and generate a homogeneous, temporally stable magnetic field at the sample location during operation, the magnetic field meeting requirements for obtaining a high-resolution magnetic resonance spectrum and having a magnetic stray field in an outer space which is substantially reduced compared to a non-actively shielded magnet system.

Superconducting NMR spectrometer magnet systems of the instant Assignee disclose means for stabilizing the magnetic field generated in the measuring volume of a high-resolution magnetic resonance spectrometer by a superconductingly short-circuited main coil located in a cryostat, in particular, in a high-resolution NMR spectrometer, the means comprising one or more compensation coils which are dimensioned and disposed such that they are commonly suitable to largely compensate for field drifts of the superconductingly short-circuited main coil in the measuring volume.

High-resolution NMR spectrometers must have magnetic fields with good temporal stability in addition to extremely good magnetic field homogeneity over the sample volume. Towards this end, the superconducting main coil of the magnet is superconductingly short-circuited during operation. The properties of the superconducting short-circuit switch, the quality of the superconducting coil wires and superconducting joints between individual wire sections of the coil must therefore meet stringent requirements. During short-circuit operation, decay times of the superconducting coil current of several 10,000 years must be guaranteed.

Temporary fluctuations of the magnetic field at the sample location may be compensated for using a so-called lock system. Towards this end, the spectrometer measures a separate NMR signal of a lock substance (i.a. deuterium) in a frequency band provided for this purpose, and its frequency is stabilized through a feedback circuit using a small resistive compensation coil (lock coil) in the room temperature bore of the magnet system.

A superconductingly short-circuited magnet coil keeps the magnetic flux through its bore constant, i.e. the superconducting current changes spontaneously in response to action of e.g. an external disturbance field, such that the total flux through the coil does not change. This does not generally mean that the field in the working volume remains absolutely homogeneous and constant, since the local field distribution of a disturbance and of the main magnet coil do not coincide. Prior art has proposed compensation of these deviations through the design of the main coil geometry, additional superconducting coils or through active control measures (U.S. Pat. No. 4,974,113; U.S. Pat. No. 4,788,502; U.S. Pat. No. 5,278,503).

High-resolution NMR superconducting magnets generally use superconducting shim coil sets to initially homogenize the field at the sample location. During operation, the individual coil sets are charged with a correction current and are superconductingly short-circuited. The shim coil sets may also comprise a so-called $B_0$ coil which can generate a sufficiently homogeneous, small additional field at the sample location. It is thereby possible to finely and precisely adjust the field or the proton frequency to a predetermined value without opening the superconducting circuit of the main coil. Moreover, one has known for some time that, within certain limits, a main coil drift can also be compensated for via a short-circuited $B_0$ coil. Towards this end, the $B_0$ coil must be disposed and dimensioned such that the field decay of the main coil induces a counter current in the $B_0$ coil which causes the field at the sample location to remain constant. This method is limited in that the current through the $B_0$ coil must not get excessively large. This may be limited by the wire which is used. In any case, the contribution of the (low homogeneity) $B_0$ coil must remain sufficiently small that the field homogeneity throughout the sample is not impaired. Moreover, in case of a quench, the $B_0$ coil could be overloaded and destroyed through the required inductive coupling between the $B_0$ coil and the main coil. Corresponding protective means must therefore be introduced, which results in additional expense.

The production of superconducting high-field magnets for high-resolution NMR spectrometers (and also ICR spectrometers) has reached a very high level of quality and reliability. However, an occasional, very expensive magnet system may considerably exceed the specified limits for the drift, while otherwise being quite stable. Compensation of the drift via the lock coil or a $B_0$ coil of the shim system rapidly exhausts their above-mentioned limits and the time intervals between readjustment of the overall field (including associated opening of the superconducting main circuit, introduction of current rods, helium loss etc.) become unreasonably short.

For this reason, there is a need for a superconducting magnet system of the above-mentioned type which compensates for drifts, which are approximately one order of magnitude above those maximally specified, and for a long time, thereby preventing inadmissible deterioration of the homogeneity and stability of the magnetic field at the sample location. It should preferably also be possible to correct finished, drifting main coils.

US-B1 2002/101240 discloses mounting one or more superconducting drift compensation coils within the cryostat in a radially outer region at a temperature which is higher than that of the superconducting magnet coil. The superconducting drift compensation coils may be completely or temporarily superconductingly short-circuited or may also be operated permanently using an external power supply.

In accordance with US-B1 2002/101240, a superconducting compensation coil, in particular, of high-temperature superconducting material at a temperature level above that of the main coil, may be disposed radially outside of the main coil, in particular, in a nitrogen tank of the magnet cryostat or in thermal contact with a refrigerator stage of the cryostat in a temperature range between 20K and 100 K. A current flows through the coil to compensate for the decay of the magnet field through the main field drift at the sample location. A larger distance from the sample location facilitates keeping the compensation field sufficiently homogeneous, e.g. using merely an appropriate Helmholtz arrangement.

The use of superconducting wire permits generation of a sufficiently large current.

Advantageous arrangement e.g. in the nitrogen tank ensures that the superconducting magnet coil need not be changed and installations or modifications on the helium tank are not required.

In contrast thereto, US-B2 6,624,732 proposes operation of a slightly drifting magnet coil such that it is not completely superconductingly short-circuited but has a very small resistance. During operation, the full coil current is always supplied from the power supply or, to be more exact, a slightly higher current, which has an appropriate strength such that the voltage drop over the small resistance is just sufficient to compensate for the drift of the magnet coil. In this manner, the full current is introduced into the cryostat and the power supply noise which is transferred into the magnet coil is negligibly small due to the nearly complete short-circuit across the small resistance.

Since NMR high-field magnet coils are extremely expensive and a coil with a drift which cannot be compensated for, is essentially worthless, there is always a need for inexpensive and operationally tolerable solutions to the drift problem, in particular, in the extreme high-field region.

The last-mentioned variant is problematic in that permanent operation of a high-current power supply is required which i.a. also introduces heat into the cryostat. The variant of US-B1 2002/101240 supplies substantially smaller currents and is locally separated from the magnet coil.

The drift compensation mechanism is advantageously mechanically and also thermally connected to the magnet coil i.a. to prevent e.g. disturbances through vibrations of the drifting coil in the field of the magnet coil, thereby, however, optimally utilizing the advantages of an arrangement outside of the magnet coil.

SUMMARY OF THE INVENTION

The object of the instant invention is achieved in a surprisingly simple and effective manner in that the drift compensation coil or partial coils thereof is/are rigidly mechanically and thermally connected to the shielding coil or partial coils thereof, in particular, in that it or they is/are wound thereon, wherein the drift compensation coil is magnetically decoupled from the magnet coil, i.e. the magnetic flux through the drift coil which is generated by the main coil in combination with the shielding coil vanishes and the drift compensation coil is at least temporarily connected to an external current source to control or regulate the current fed into the drift compensation coil in accordance with a predetermined program, such that the field at or close to the sample location only differs from a desired value within a predetermined range.

Active regulation produces no additional superconductingly short-circuited circuit which could be charged in an uncontrolled manner. No compensation current flows if the current source is switched off. Moreover, due to the use of a superconductor, in particular, a relatively thin wire, which is operated at low current and high charging voltage of the compensation coil(s), the heat input in the cryostat is negligibly small. The greater inductance of a compensation coil made from thin wire, which is higher for identical generated fields, is insignificant.

Fine adjustment is preferably effected using a lock circuit, if required, in addition to and as a supplement to the already existing resistive lock. Later rough compensation adjustment in long time interval stages may thereby be sufficient. The drift compensation coil may also be temporarily superconductingly short-circuited. One must thereby take into consideration the fact that it then no longer compensates for a continuous drift. In this case, fine adjustment and temporary drift compensation is provided by the (resistive) lock system. Due to the fact that the contribution of the compensation field to the overall field is very small (as small as approximately $10^{-5}$), the noise which is thereby inevitably introduced into the high-resolution spectrometer can be tolerated, since it can be easily kept below $10^{-6}$. The inductive coupling between the compensation coil and the superconducting circuit of the main coil is eliminated and inductive coupling to the shim system should either be eliminated in the arrangement or be taken into consideration in the design.

In one embodiment, the compensation coil comprises a superconducting switch and is at least temporarily superconductingly short-circuited during operation. In this phase, it provides only a constant field contribution which can be brought to the desired value (or above) from time to time after opening of the switch using a higher compensation current through the external power supply.

Actively shielded magnet systems of modern NMR or ICR spectrometers have two serially connected partial coils (main coil and shielding coil) which generate opposite fields such that the overall dipole moment of the arrangement and largely the stray field, vanish. As mentioned above, resistive and/or superconducting compensation arrangements are also usually provided to minimize the influence of external disturbances at the sample location. The present invention is preferably used in combination with such measures, wherein the interaction between the different shielding and compensation measures must always be taken into account and must either be partially eliminated (coupling zero) or the overall behavior of the apparatus must be explicitly considered in the design.

The invention is explained in more detail below with reference to the drawing.

b) of the compensation field ($\Delta B_{komp}$) generated by the drift compensation coil(s);

c) of the field ($\Delta B_{lock}$) generated by fine adjustment (lock system), for the case of drift compensation in stages in time intervals;

FIG. 3 shows the time behavior a) of the (drifting) main magnetic field ($\Delta B_0$) at the sample location;

b) of the compensation field ($\Delta B_{komp}$) generated by the drift compensation coil(s);

c) of the field ($\Delta B_{lock}$) generated through fine adjustment (lock system), for the case of drift compensation in linear approximation which is updated at time intervals.

DESCRIPTION OF THE PREFERRED EMBODIMENT

Figure 1:
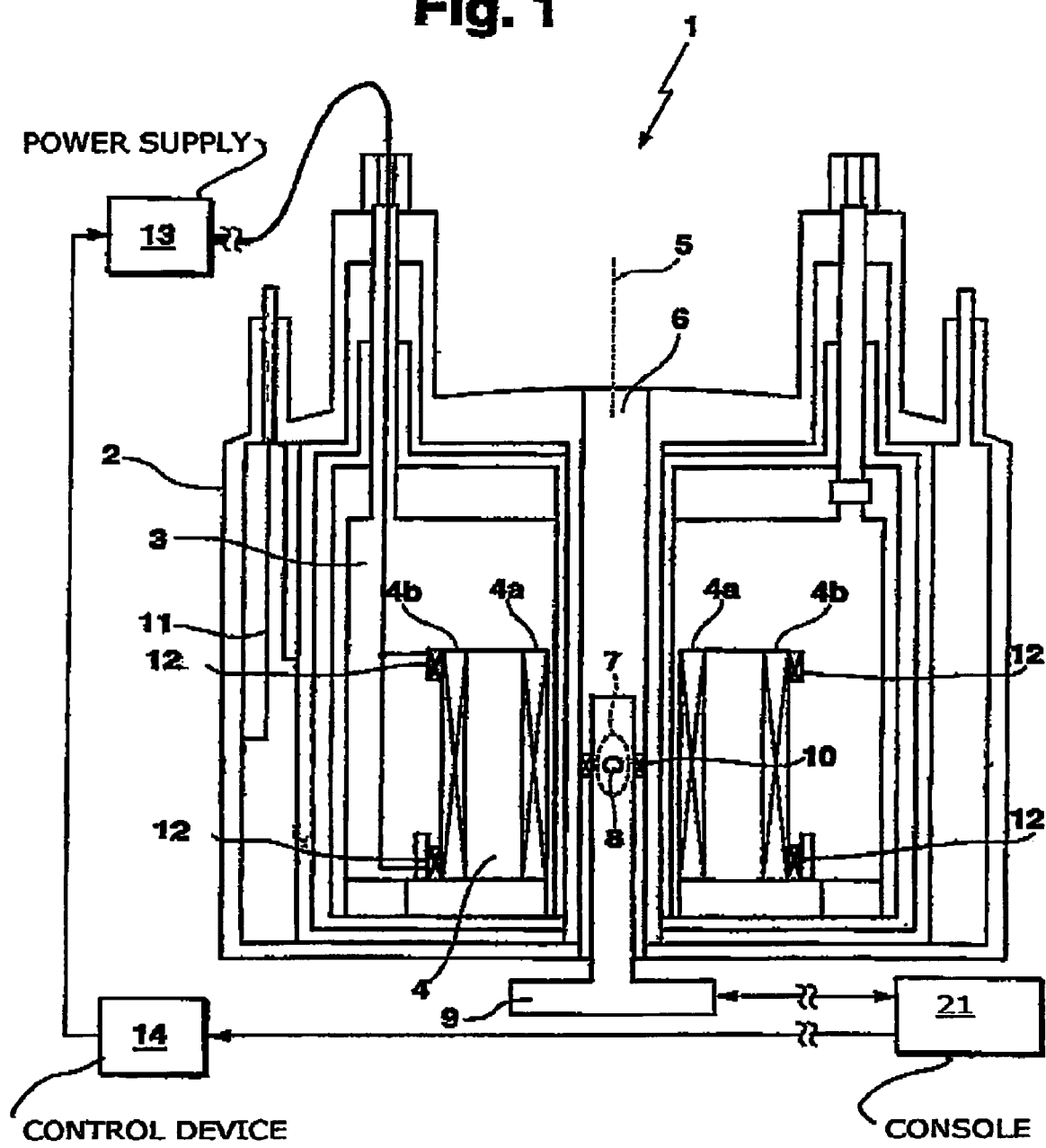
FIG. 1 is an extremely schematic section through the cryostat of a nuclear magnetic resonance apparatus with a main coil, a shielding coil, and a drift compensation coil wound thereon, in the helium tank.

FIG. 1 schematically shows, in detail, a section through the substantially rotationally-cylindrical cryostat of the superconducting magnet system 1 e.g. of a high-resolution NMR apparatus. The magnet coil 4 which is superconductingly short-circuited during operation is disposed in a helium tank 3 of the cryostat 2 and is actively shielded, e.g. consists of two opposite partial coils 4a (main coil) and 4b (shielding coil). The cryostat 2 has a room temperature bore 6 along its cylindrical axis 5, within which a sample 8 is disposed in a measuring region 7 at the center of the magnet coil 4, the sample being surrounded by an RF transmitter and receiver coil arrangement 9 (probe head).

A so-called lock coil 10 is also located inside the room temperature bore 6, optionally integrated in the probe head 9, for fine correction of the magnetic field in the measuring region. This lock coil 10 is not or only slightly coupled to the magnet coil 4. The correction current through the lock coil 10 in an NMR spectrometer is generally controlled via the NMR console 21 by an NMR lock signal of a lock substance which is added to the sample 8, such that the NMR frequency of the lock substance (e.g. deuterium) and thereby the magnetic field at the sample location remain constant. Such lock arrangements are known in the art and are very precise. However, they have a small range and are designed to correct fluctuations about the desired value and are not suited to correct continuous field drifts.

The helium tank 3 of the cryostat 2 is surrounded by a nitrogen tank 11. Drift compensation coils 12 are disposed in the helium tank 3 and are wound onto the shielding coil 4b and are thereby mechanically and thermally rigidly connected thereto. The compensation coils 12 are supplied with current from a power supply 13 which is controlled by a control device 14. The rigid connection between magnet coil 4 and drift compensation coil 12 prevents relative mutual oscillations between them and thereby disturbances. The drift compensation coils 12 are made from thin superconducting wire and therefore carry only a relatively small current despite the relatively high maximum current density (with correspondingly increased voltage during operation by the power supply 13), thereby preventing the feed lines from excessively heating the helium tank 3 and the magnet coil 4 disposed therein. The drift compensation coil arrangement 12 must be largely decoupled from the magnet coil 4 and, if possible, also from the lock coil 9, to facilitate control and increase operational safety. Any drift of the main coil 4 during short-circuited operation can be compensated for by the drift compensation coil 12. Rough compensation of the drift is thereby sufficient, e.g. in steps or in linear approximation and is controlled and adjusted from time to time. Fine adjustment is provided by the lock system, i.e. the drift compensation must only ensure that the deviation from the desired value remains sufficiently small that the maximally admissible lift for the lock system is not exceeded. A corresponding indicator is, of course, the control current through the lock coil 10. In case of a long-term experiment, a relatively large negative current will initially be transmitted through the drift compensation coil 12 and is reduced with continuing drift of the main coil 4 and finally changes sign. The maximum admissible current through the drift compensation coil 12 and the strength of the drift thereby preset a maximum time for an experiment at constant magnetic field. The maximum field of the drift compensation coil 12 at the sample location is orders of magnitude higher than that of the lock coil 10 but is still very small compared to that of the main coil 4 such that this compensation field can be maintained sufficiently homogeneous and the noise introduced by the power supply 13 is also within acceptable limits. Mounting of the compensation coil(s) 12 on the shielding coil 4b is advantageous in that previous mounting is simplified as well as later mounting via winding onto the finished magnet coil 4. This is advantageous compared to mounting to the nitrogen tank 11, since the magnetic field generating coils are rigidly interconnected (except for the lock coil and optionally a room temperature shim system) to form a compact unit which has substantially commonly guided leads and generally largely common feed lines for superconducting shim coils, switch heaters and sensors.

In an alternative operation of the drift compensation coil 12 which is permanently actively controlled by the power supply 13, the drift compensation coil 12 may also be temporarily superconductingly short-circuited, despite the fact that it is decoupled from the magnet coil 4 and can therefore not compensate for its further drift in the short-circuited state. In this case, the controlled lock coil takes over drift compensation as long as the drift compensation coil 12 remains short-circuited or the Bo coil of the superconducting shim coil set is used. In principle, several independent drift compensation coil sets 12 may also be provided which are superconductingly short-circuited after a maximum current has been reached, after which the supplied current can be reduced again and thermal load is eliminated. The next set is then connected and charged while the drift of the magnet coil 4 continues.

Figure 2:
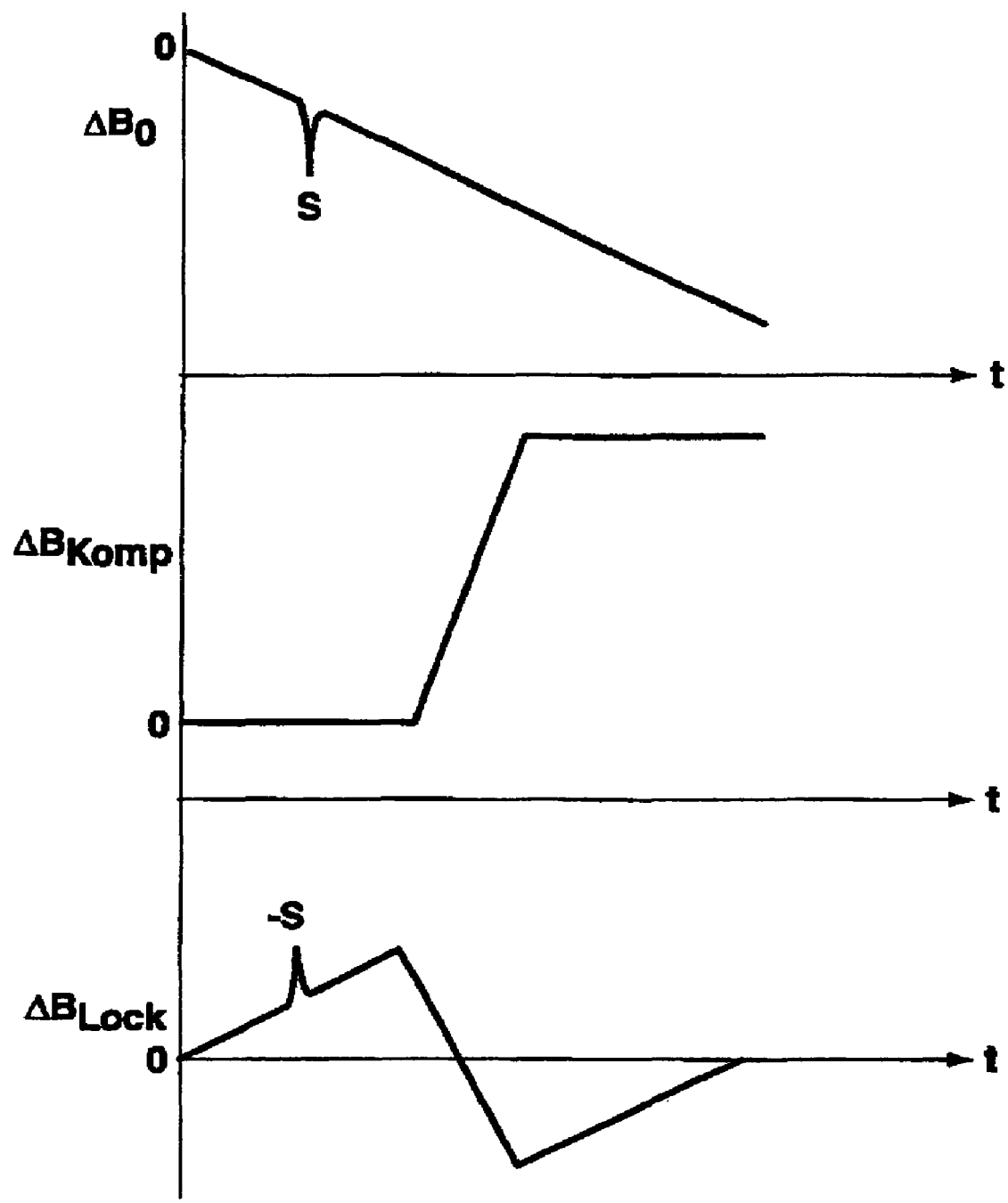
FIG. 2 shows the time behavior a) of the (drifting) main field magnet ($\Delta B_0$) at the sample location.

FIG. 2 shows the time behavior of the (drifting) main magnetic field at the sample location, of the compensation field generated by the drift compensation coil(s) and of the field generated through fine adjustment (lock system) in case of drift compensation in time interval stages, which finally produces a constant overall field at the sample location. A fluctuation S which is caused by external disturbances is eliminated by the lock system using an opposite field pulse −S.

FIG. 3 shows the corresponding behavior for drift compensation in linear approximation, the time behavior of the (drifting) main magnetic field at the sample location, of the compensation field generated by the drift compensation coil(s) and of the field generated by fine adjustment (lock system) which finally produces a constant overall field at the sample location thereby minimally loading the lock coil.

The drift may also be compensated for through other approximations. A linear approximation will generally be sufficient and later correction of the slope will be required only at relatively large time intervals.

It is clear that the invention is not limited to the embodiments but may be modified. The invention can advantageously be combined with a plurality of conventional compensation measures for internal drifts and external disturbances. The coupling of the controlled, regulated or short-circuited coil circuits must thereby always be taken into consideration.

We claim:

1. An actively shielded superconducting magnet system for high-resolution magnetic resonance spectral analysis of a sample, the system comprising:
    a substantially cylindrical cryostat having an axial, room temperature bore for receiving the sample;
    a radio frequency transmitting and detecting system;
    a magnet coil which is superconductingly short-circuited during operation, said magnet coil having a main coil and a shielding coil which radially surrounds said main coil, said magnet coil being disposed at a low temperature within said cryostat to surround the sample and to generate a homogeneous, temporally stable magnetic field at the sample location, said magnet coil having a stray magnetic filed which is considerable reduced relative to that of a non-actively shielded magnet system;

a drift compensation coil rigidly mechanically and thermally connected to said shielding coil, said drift compensation coil being substantially magnetically decoupled from said magnet coil;

an external current supply; and means for connecting said external current supply, at least in time intervals, to said drift compensation coil to control and regulate a current fed into said drift compensation coil in accordance with a predetermined program such that the field at the sample location only differs from a desired value within a predetermined range.

2. The magnet system of claim 1, wherein said drift compensation coil is wound upon said shielding coil.

3. The magnet system of claim 1, wherein a magnetic flux through said drift compensation coil, generated by said main coil in combination with said shielding coil, substantially vanishes.

4. The magnet system of claim 1, wherein said drift compensation coil comprises a high-temperature superconducting material.

5. The magnet system of claim 1, wherein said drift compensation coil can be temporarily superconductingly short-circuited during operation.

6. The magnet system of claim 1, wherein said magnet coil comprises several serially connected sections which are protected, in response to uncontrolled transfer into a normally conducting state, by a network of protective resistances and/or protective diodes.

7. The magnet system of claim 1, wherein said magnet coil generates a magnetic field at the sample of more than 15 Tesla.

8. The magnet system of claim 7, wherein said magnet coil generates a magnetic field at the sample of more than 20 Tesla.

9. The magnet system of claim 1, wherein said drift compensation coil comprises a plurality of compensation coils.

10. The magnet system of claim 1, wherein said magnet coil is disposed in a helium tank.

11. The magnet system of claim 1, wherein the magnetic field at the sample during superconductingly short-circuited operation has a field drift of between $10^{-8}$ and $10^{-5}$ per hour.

12. A high-resolution magnetic resonance spectrometer comprising the magnet system of claim 1.

13. The magnetic resonance spectrometer of claim 12, further comprising means for precise determination of the magnetic field at the sample.

14. The magnetic resonance spectrometer of claim 13, further comprising means for controlling an instantaneous value of the magnetic field at the sample to a desired value.

15. The magnetic resonance spectrometer of claim 14, wherein said magnetic filed controlling means comprise a lock system.

16. A method for operating the high-resolution magnetic resonance spectrometer of claim 12, wherein a field drift of said main coil is roughly compensated for using said drift compensation coil and an instantaneous value is finely adjusted using an additional lock system.

17. The method according to claim 16, wherein a rough compensation is performed in stages, an amount and/or time intervals of which is/are adjusted through occasional determination of an instantaneous value of the field at the sample.

18. The method of claim 17, wherein rough compensation is generated through a temporally monotonically varying current through said drift compensation coil having a time dependence which is determined and updated through occasional determination of an instantaneous value of the magnetic field at the sample.

19. The method of claim 18, wherein said monotonically varying current is a linearly varying current.

* * * * *